United States Patent [19]

Miyazaki

[11] Patent Number: 5,677,531

[45] Date of Patent: Oct. 14, 1997

[54] SCANNING ELECTRON MICROSCOPE

[75] Inventor: Yasumichi Miyazaki, Sagamihara, Japan

[73] Assignee: Nikon Corporation, Tokyo, Japan

[21] Appl. No.: 691,029

[22] Filed: Aug. 7, 1996

[30] Foreign Application Priority Data

Aug. 8, 1995 [JP] Japan .................................. 7-202346
Jan. 23, 1996 [JP] Japan .................................. 8-009095

[51] Int. Cl.$^6$ .................................................. H01J 37/244
[52] U.S. Cl. .................................... 250/310; 250/397
[58] Field of Search ................................. 250/310, 397, 250/441.11, 442.11

[56] References Cited

U.S. PATENT DOCUMENTS

| 4,897,545 | 1/1990 | Danilatos | 250/310 |
| 5,396,067 | 3/1995 | Suzuki et al. | 250/310 |
| 5,466,936 | 11/1995 | Kohama et al. | 250/310 |

FOREIGN PATENT DOCUMENTS 6-60841  3/1994  Japan .

*Primary Examiner*—Kiet T. Nguyen
*Attorney, Agent, or Firm*—Oliff & Berridge

[57] ABSTRACT

A scanning electron microscope is provided for forming an image of a specimen based upon a secondary electron signal corresponding to secondary electrons detected by a secondary electron detecting electrode. The secondary electrons are emitted from the specimen when irradiated with a beam of electrons, and multiplied in a secondary electron multiplication region having a controlled gaseous atmosphere at a predetermined pressure. The scanning electron microscope further includes a multiplication environment detecting section that detects a physical quantity related to a degree of multiplication of the secondary electrons, and a specimen image adjusting section that adjusts an appearance of the formed image of the specimen based upon the physical quantity detected by the multiplication environment detecting section.

23 Claims, 9 Drawing Sheets

SCANNING ELECTRON MICROSCOPE

BACKGROUND OF THE INVENTION

1. Field of the Invention

The present invention relates to an environmental scanning electron microscope, for detecting secondary electrons emitted from a specimen, after multiplying the electrons in a low-vacuum gaseous atmosphere.

2. Description of Related Art

The scanning electron microscope (abbreviated as "SEM" when appropriate) has been widely used in many fields as means for observing and analyzing microforms or microstructures. When the SEM is used to observe a specimen, its electronic optical system and secondary-electron detecting system need to be held in a high vacuum, naturally requiring the specimen to be placed in a high vacuum. Accordingly, the specimen must be observed while it is in a dry state, not in a natural state. If the specimen is an insulating material, the surface of the specimen needs to be coated with a metal or otherwise treated to be conductive, since the specimen cannot be observed while it is charged. In recent years, however, it is increasingly required to observe the specimen without drying the same, namely, observe the specimen while it is held in a more natural state and contains water. To meet this requirement, an environmental SEM has become widely used which employs an electron multiplication method that enables secondary electrons to be detected even in a considerably low vacuum, e.g., 2700 Pa that is a saturated water vapor pressure at a normal temperature. In this environmental SEM, a gas (water vapor or steam in a typical example) having an electron multiplication function is supplied to a specimen chamber until the pressure in the chamber becomes equal to or lower than 2700 Pa. In this condition, the specimen is irradiated with a beam of electrons while a positive voltage of several hundreds of volts is applied to a secondary electron detecting electrode that is opposed to the specimen, as disclosed in Japanese laid-open Patent Publication No. 6-60841. The secondary electrons generated from the specimen collide with gas molecules and repeatedly ionize the molecules, thereby to be multiplied and then captured by the secondary electron detecting electrode. A signal corresponding to the secondary electrons captured by the electrode is sent out to a suitable signal processing circuit, and converted by the circuit into an image of the specimen. The image of the specimen is displayed on a cathode-ray-tube (CRT) display to be observed, or photographed. Positive ions generated during the electron multiplication process are fallen onto the specimen, so as to neutralize charge of the specimen. This eliminates the need to treat the specimen to be conductive even if it is an insulating material, and enables the specimen to be observed without being treated.

In operation of the environmental SEM as described above, the degree of vacuum (gas pressure) in the specimen chamber and the voltage applied to the secondary electron detecting electrode are set or determined each time the specimen to be observed is replaced by another one. However, the intensity of the secondary electron signal varies to a considerably large degree even with slight amounts of variations in the voltage applied to the secondary electron detecting electrode and the degree of vacuum of the specimen chamber, resulting in inappropriate luminance and contrast of the finally observed image of the specimen. Each time the specimen is replaced by another one, therefore, the operator needs to manually adjust the voltage applied to the secondary electron detecting electrode, or amplifier gain, brightness level and other factors of the circuit for processing the secondary electron signal, so as to suitably control the luminance and contrast of the image of the specimen.

SUMMARY OF THE INVENTION

It is therefore an object of the present invention to provide an environmental scanning electron microscope, which is able to easily obtain an optimum specimen image.

The above object may be accomplished according to one aspect of the present invention, which provides a scanning electron microscope for forming an image of a specimen based upon a secondary electron signal corresponding to secondary electrons detected by a secondary electron detecting electrode, the secondary electrons being emitted from the specimen when irradiated with a beam of electrons and multiplied in a secondary electron multiplication region having a controlled gaseous atmosphere at a predetermined pressure, which scanning electron microscope comprises: a multiplication environment detecting section that detects a physical quantity related to a degree of multiplication of the secondary electrons; and a specimen image adjusting section that adjusts an appearance of the formed image of the specimen based upon the physical quantity detected by the multiplication environment detecting portion.

According to another aspect of the present invention, there is provided a scanning electron microscope for forming an image of a specimen based upon a secondary electron signal corresponding to secondary electrons detected by a secondary electron detecting electrode, the secondary electrons being emitted from the specimen when irradiated with a beam of electrons and multiplied in a secondary electron multiplication region having a controlled gaseous atmosphere at a predetermined pressure, which scanning electron microscope comprises: an arithmetic section that calculates a physical quantity related to a degree of multiplication of the secondary electrons, depending upon an accelerating voltage of the beam of electrons, and a setting section that sets the physical quantity based upon a result of calculation of the arithmetic portion.

DESCRIPTION OF THE PREFERRED EMBODIMENTS

First Embodiment

Figure 1:
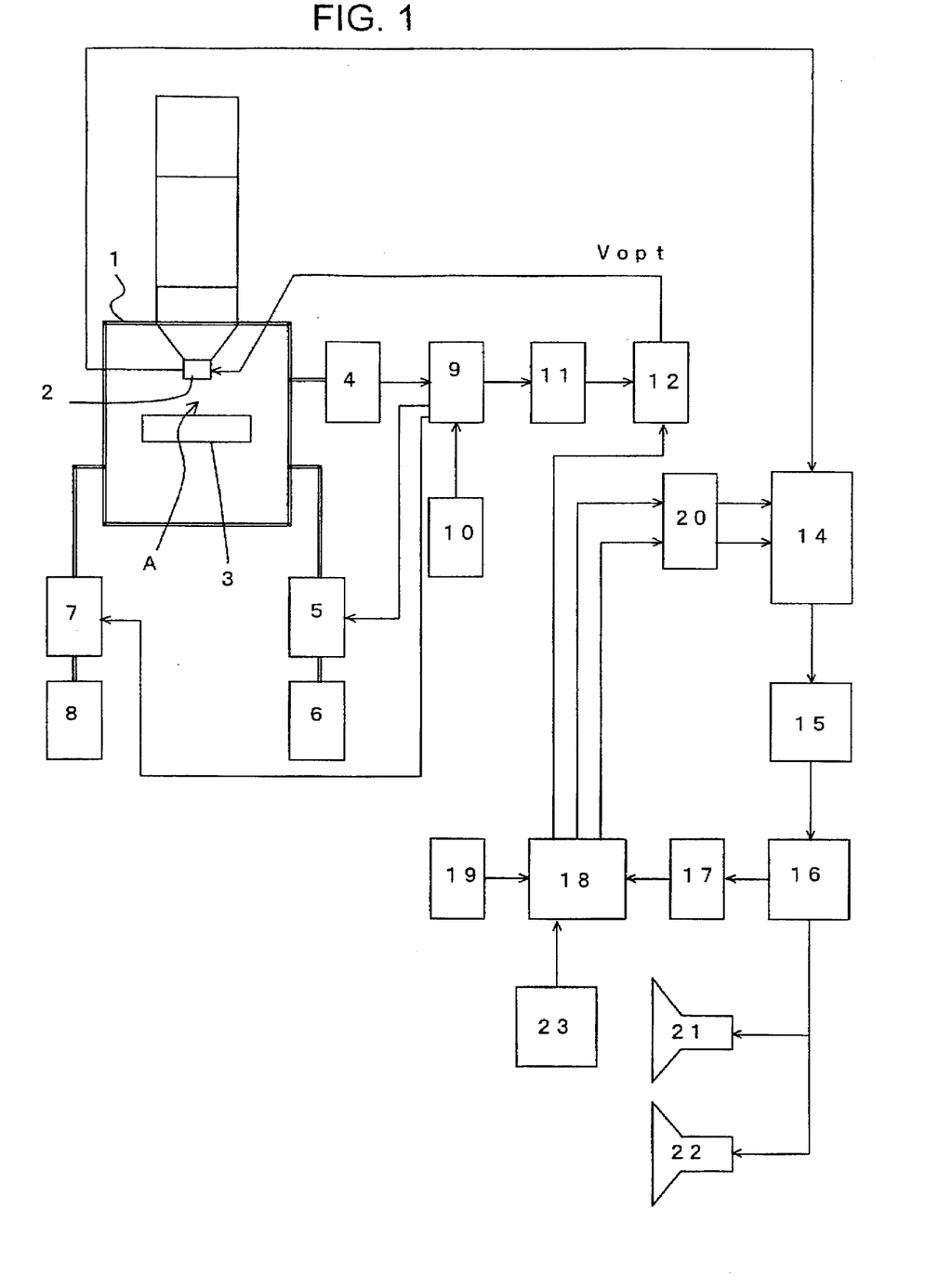
FIG. 1 is a block diagram of an environmental SEM constructed according to the first embodiment of the present invention.
Figure 2:
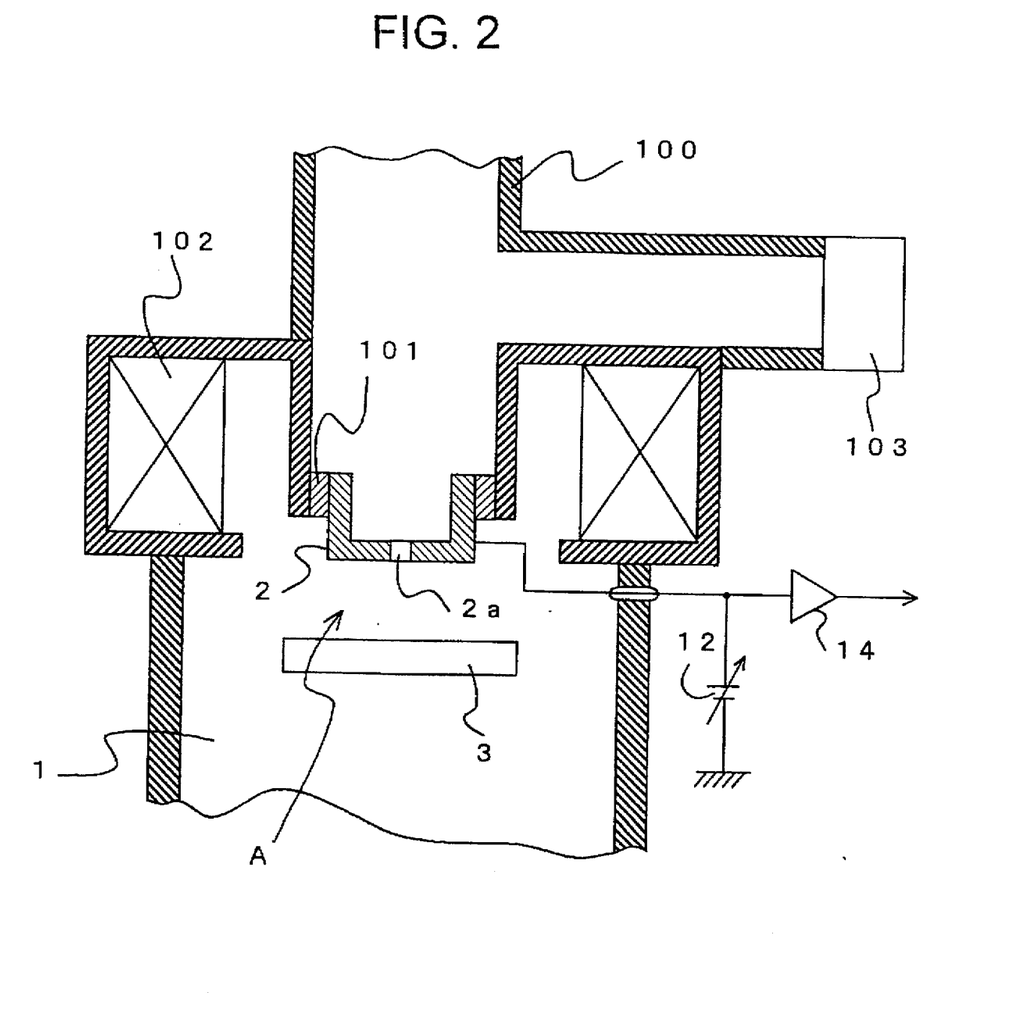
FIG. 2 is a view showing the arrangement of a secondary electron detecting electrode of the SEM of FIG. 1 and its surroundings.
Figure 3:
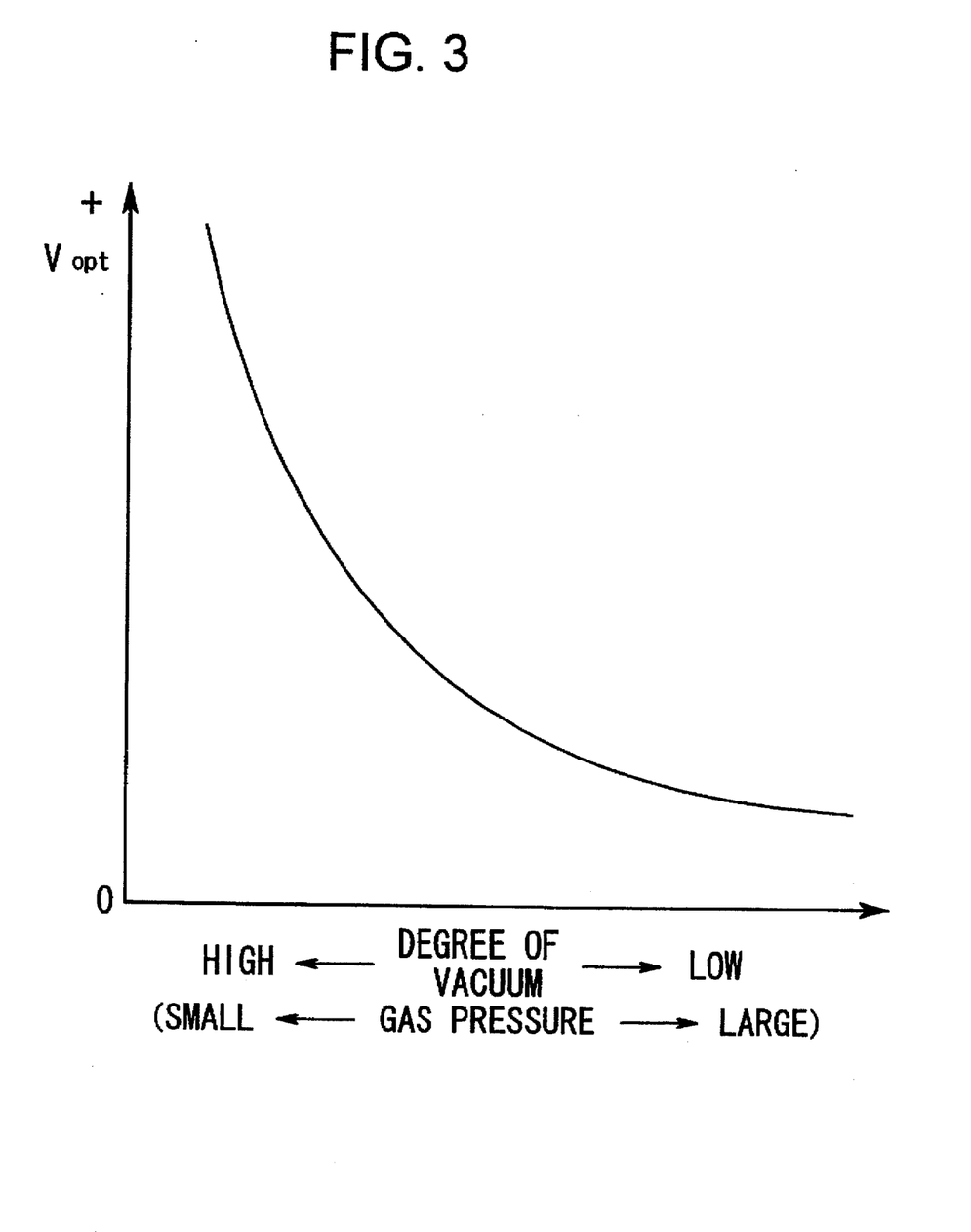
FIG. 3 is a graph showing an example of the relationship between a degree of vacuum and an optimum voltage level, which relationship is given to an arithmetic circuit of the SEM of FIG. 1.

Referring first to FIG. 1 through FIG. 3, there will be described in detail the first embodiment of the present invention. FIG. 1 is a block diagram showing an environmental SEM (scanning electron microscope) constructed according to the first embodiment of the invention. Reference numeral 1 denotes a specimen chamber, 2 denotes a secondary electron detecting electrode, and 3 denotes a specimen. The secondary electron detecting electrode 2 is attached via an insulator 101 to the lower end of a vacuum chamber 100 in which an electron gun (not shown) is accommodated, as shown in FIG. 2 by way of example. This electrode 2 is formed at its center with an aperture 2a which allows a beam of electrons emitted from the electron gun toward the specimen 3 to pass therethrough. To the secondary electron detecting electrode 2, there are connected a control power source 12 and a pre-amplifier 14. In FIG. 2, reference numeral 102 denotes an objective lens for focusing the beam of electrons on the specimen 3, and 103 denotes a vacuum pump for evacuating the vacuum chamber 100. The vacuum chamber 100 is divided by apertures (not shown) into a plurality of rooms in the direction of the optical axis of the electron gun, which rooms are respectively evacuated by means of different vacuum pumps.

As shown in FIG. 1, a gas supplier unit 6 and a rotary pump 8 are connected to the specimen chamber 1 through a valve 5 and a valve 7, respectively. The specimen chamber 1 is evacuated when the valve 7 is open while the rotary pump 8 is being driven. With the valve 5 being open, a gas, e.g., water vapor or steam, having an electron multiplication function is supplied from the gas supplier unit 6 to the specimen chamber 1. Vacuum gauge 4 detects a degree of vacuum (gas pressure) in a multiplication region A of the specimen chamber 1 located between the secondary electron detecting electrode 2 and the specimen 3, and the degree of vacuum detected by the vacuum gauge 4 is fed to a vacuum degree control circuit 9. The vacuum degree control circuit 9 controls open and closed states of the valves 5, 7 so that the degree of vacuum detected by the vacuum gauge 4 coincides with a target degree of vacuum determined by a vacuum degree setting device 10. The target degree of vacuum is set to within a range of 100–2700 Pa, for example.

When the degree of vacuum is controlled to the target value by the vacuum degree control circuit 9, the degree of vacuum obtained at this point of time is fed to an arithmetic circuit 11. The arithmetic circuit 11 then calculates an optimum level +$V_{opt}$ of voltage applied to the secondary electron detecting electrode 2 which corresponds to the current degree of vacuum, according to a given function as described later, and commands the control power source 12 to provide the optimum voltage +$V_{opt}$. The control power source 12 thus applies the positive voltage +$V_{opt}$ to the secondary electron detecting electrode 2. With the optimum level +$V_{opt}$ of voltage applied to the secondary electron detecting electrode 2, characteristic values, such as luminance and contrast, related to the visibility of the image of the specimen are kept within permissible ranges. An example of the function given to the arithmetic circuit 11 is shown in FIG. 3. As the degree of vacuum decreases or the gas pressure increases in this example, the frequency of collision of secondary electrons with gas molecules increases with a result of an increased electron multiplication factor, whereby the applied voltage (+$V_{opt}$) is lowered.

The graph of FIG. 3 can be easily obtained through experiments or computer simulation.

Referring back to FIG. 1, the specimen 3 is irradiated with a beam of electrons when the degree of vacuum in the multiplication region A of the specimen chamber 1 is controlled to the target value, and the optimum voltage $V_{opt}$ is applied to the secondary electron detecting electrode 2. The secondary electrons emitted from the specimen 3 are multiplied by the gas while passing through the multiplication region A, and then captured by the secondary electron detecting electrode 2. A secondary electron signal representative of the secondary electrons captured by the electrode 2 is successively amplified by the pre-amplifier 14 and a main amplifier 15, and then converted into a digital image signal by an A/D converter 16. The image signal generated from the A/D converter 16 is fed to a memory 17, a CRT display 21 used for observation of the image of the specimen, and a CRT display 22 used for photographing of the specimen image. Fine control circuit 18 that is connected to the memory 17 finely controls or adjusts the optimum voltage level $V_{opt}$ generated from the control power source 12, referring to the image signal fed to the memory 17, so as to optimize the luminance and contrast of the image of the specimen displayed on the CRT displays 21, 22. At the same time, the fine control circuit 18 finely controls or adjusts the gain and DC level of the pre-amplifier 14 through a D/A converter 20. In the case where the luminance is lower than its optimum value, for example, the optimum voltage $V_{opt}$ is slightly increased so as to increase the intensity of the secondary electron signal.

Mode designator 19 is provided for placing the fine control circuit 18 in a selected one of an automatic follow-up mode and a single-command mode, in response to an operation of the operator. When the automatic follow-up mode is selected, the fine control circuit 18 monitors the image signal in the memory 17 to check if the luminance and contrast of the image of the specimen on the CRT displays 21, 22 are held in the optimum ranges, and automatically controls the output $V_{opt}$ of the control power source 12 and the gain and DC level of the pre-amplifier 14 if the luminance and contrast are outside the optimum ranges. When the single-command mode is selected, the above-described fine adjustment is effected by the fine control circuit 18 only when a setting switch 23 is operated by the operator to generate a signal for starting the adjustment.

Second Embodiment

Figure 4:
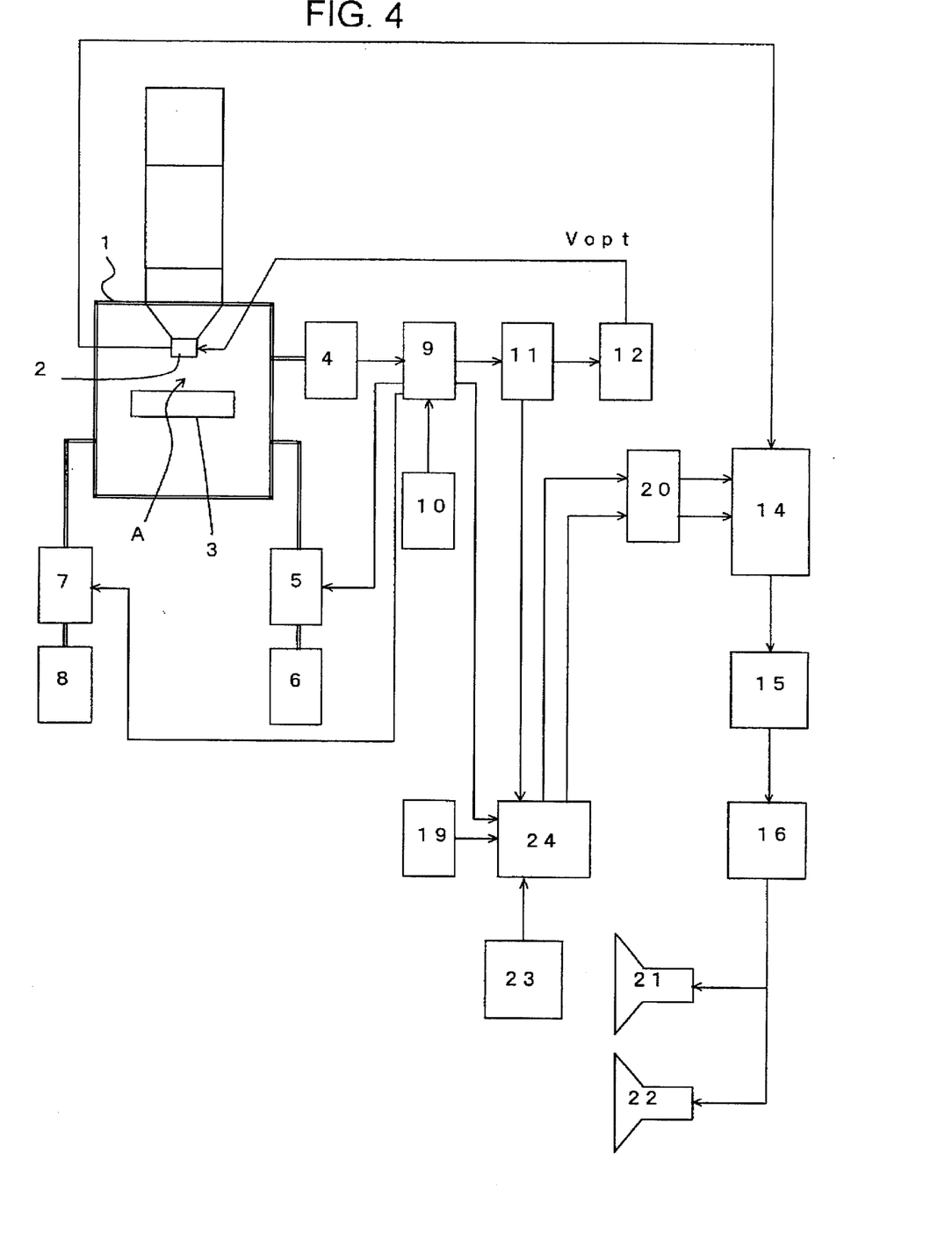
FIG. 4 is a block diagram of an environmental SEM constructed according to the second embodiment of the present invention.

FIG. 4 shows the second embodiment of the present invention. In FIG. 4, the same reference numerals as used in FIG. 1 are used to identify corresponding elements, of which no detailed explanation will be provided.

In the embodiment of FIG. 4, when the degree of vacuum in the multiplication region A and the voltage of the secondary electron detecting electrode 2 are controlled by the vacuum degree control circuit 9 and the arithmetic circuit 11, signals representing the controlled degree of vacuum and level of voltage are fed to an adjustment circuit 24. The adjustment circuit 24 specifies or determines set values of the gain and DC level of the pre-amplifier needed to optimize the luminance and contrast of the image of the specimen displayed on the CRT displays 21, 22, on the basis of the current degree of vacuum and voltage applied to the electrode 2. The set values thus obtained are supplied to the pre-amplifier 14 through the D/A converter 20. The relationship between the degree of vacuum and applied voltage, and the amplifier gain and DC level can be easily obtained through experiments or computer simulation. The relationship represented in the form of a table may be preliminarily given to the adjustment circuit 24. In the present embodiment, too, the mode designator 19 and the setting switch 23 are provided to place the adjustment circuit 24 in a selected one of an automatic follow-up mode for automatically adjusting the image of the specimen, and a single-command mode for adjusting the specimen image in response to the operation of the setting switch 23.

It is to be understood that the present invention is not limited to the details of the illustrated embodiments. For example, the degree of vacuum in the specimen chamber 1 and the voltage of the secondary electron detecting electrode 2 may be manually set or established, and the gain and DC level of the pre-amplifier 14 and the like may be automatically controlled on the basis of these set values. The luminance and contrast of the image of the specimen after manually setting the degree of value and the voltage may be automatically evaluated, and the voltage applied to the secondary electron detecting electrode 2, for example, may be automatically controlled on the basis of the result of the evaluation. In the first embodiment of FIG. 1, the fine control circuit 18 may be eliminated if the luminance and contrast of the specimen image can be controlled to a practically sufficient degree only with the voltage controlled by the arithmetic circuit 11.

Third Embodiment

Figure 5:
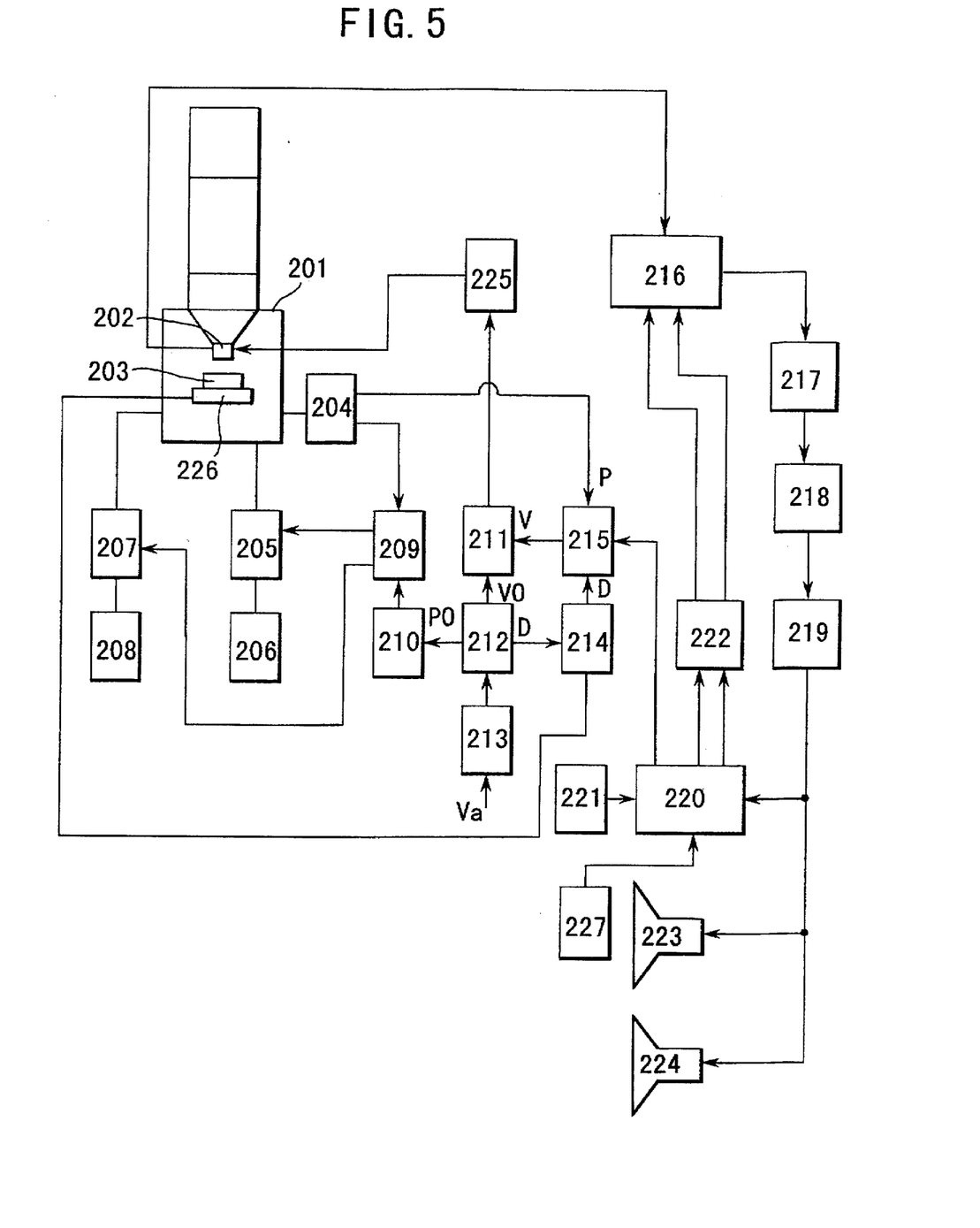
FIG. 5 is a block diagram of an environmental SEM constructed according to the third embodiment of the present invention.
Figure 6:
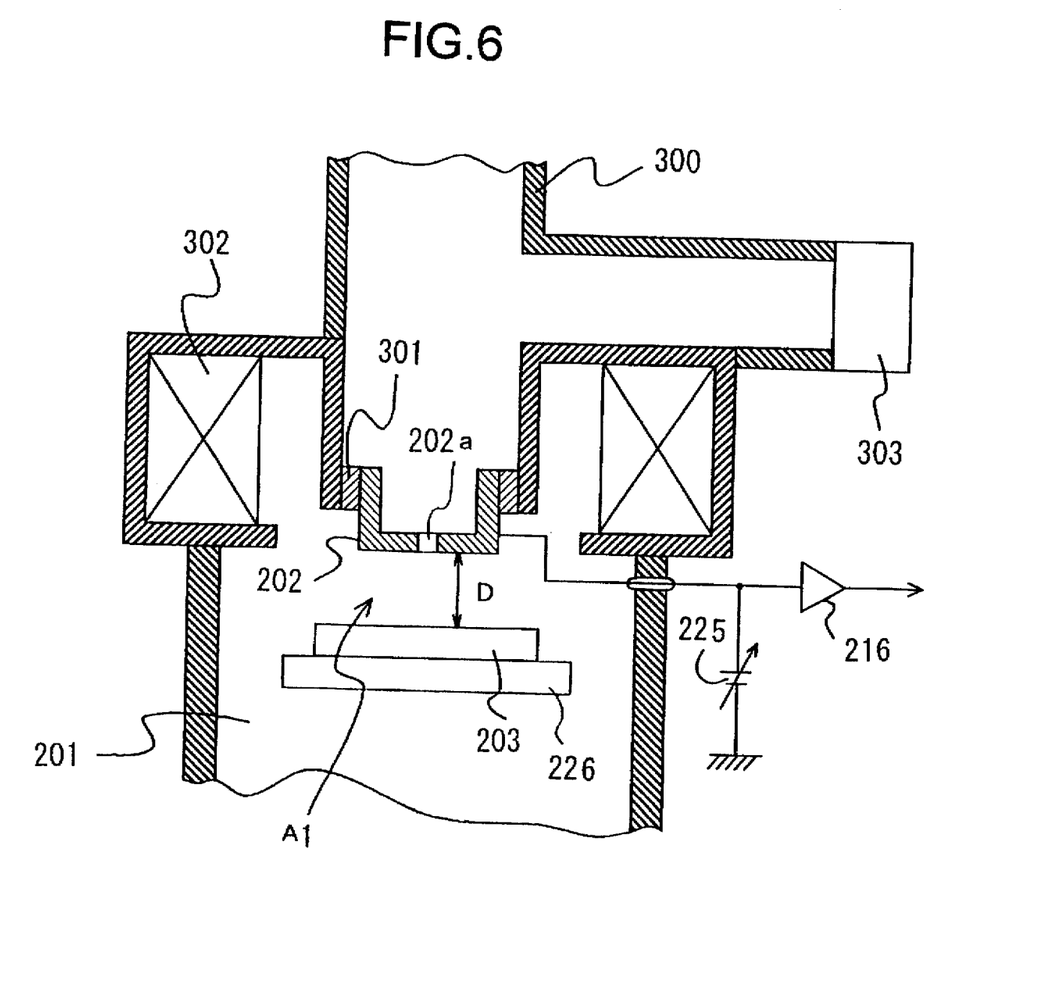
FIG. 6 is a view showing the arrangement of a secondary electron detecting electrode of the SEM of FIG. 5 and its surroundings.

Referring next to FIG. 5 through FIG. 9, there will be described the third embodiment of the present invention. FIG. 5 is a block diagram showing an environmental SEM (scanning electron microscope) constructed according to the third embodiment of the invention. Reference numeral 201 denotes a specimen chamber, 202 denotes a secondary electron detecting electrode, and 203 denotes a specimen. The specimen 203 is placed on a stage 226 that is movable in a direction toward and away from the secondary electron detecting electrode 202. The secondary electron detecting electrode 202 is attached via an insulator 301 to the lower end of a vacuum chamber 300 in which an electron gun (not shown) is accommodated, as shown in FIG. 6 by way of example. This electrode 202 is formed at its center with an aperture 202a that allows a beam of electrons emitted from the above-indicated electron gun toward the specimen 203 to pass therethrough. To the secondary electron detecting electrode 202, there are connected an electrode power source 225 and a pre-amplifier 216. In FIG. 6, reference numeral 302 denotes an objective lens for focusing the beam of electrons on the specimen 203, and 303 denotes a vacuum pump for evacuating the vacuum chamber 300. This vacuum chamber 300 is divided by apertures (not shown) into a plurality of rooms in the direction of the optical axis of the electron gun, which rooms are respectively evacuated by means of different vacuum pumps.

As shown in FIG. 5, a gas supplier unit 206 and a rotary pump 208 are connected to the specimen chamber 201 through a valve 205 and a valve 207, respectively. The specimen chamber 201 is evacuated when the valve 207 is open while the rotary pump 208 is being driven. With the valve 205 being open, a gas, e.g., water vapor or steam, having an electron multiplication function is supplied from the gas supplier unit 206 to the specimen chamber 201. Vacuum gauge 204 detects the pressure P in a multiplication region A (FIG. 6) of the specimen chamber 201 located between the secondary electron detecting electrode 202 and the specimen 203, and a signal representing the pressure thus detected is fed to a pressure control circuit 209 and an applied voltage calculating circuit 215 which will be described later.

Reference numeral 213 is an accelerating voltage setting device through which the operator enters an accelerating voltage level suitable for the specimen 203. An initial value calculating circuit 212 calculates the optimum pressure level PO, distance D (FIG. 6) between the specimen 203 and the secondary electron detecting electrode 202, and the initial level VO of the voltage applied to the secondary electron detecting electrode 202, on the basis of the accelerating voltage level entered through the accelerating voltage setting device 213. The calculated optimum. pressure level PO is fed to a pressure setting circuit 210, and the distance D is fed to a stage position control circuit 214, while the applied voltage level VO is fed to an applied voltage control circuit 211 for controlling the voltage applied to the secondary electron detecting electrode 202. The optimum pressure level PO corresponding to the accelerating voltage level may be selected from a data table preliminarily stored in a memory (not shown), rather than being obtained by computing. An applied voltage calculating circuit 215 calculates an optimum level V of the voltage applied to the secondary electron detecting electrode 202, on the basis of the pressure level P received from the vacuum gauge 204, distance D received from the stage position control circuit 214, and image information (which will be described) received from a fine control circuit 220. The optimum applied voltage level V thus calculated is fed to the applied voltage control circuit 211, which in turn controls the electrode power source 225 on the basis of the above-indicated initial applied voltage level VO or optimum applied voltage level V.

Reference numerals 216, 217 and 218 are pre-amplifier, main amplifier and A/D converter, respectively, which constitute a circuit for processing a secondary electron signal received from the secondary electron detecting electrode 202. A memory 219 stores an image signal outputted from the A/D converter 218. To this memory 219 are connected the fine control circuit 220, CRT display 223 used for observation of the image of the specimen, and CRT display 224 used for photographing of the specimen image. The fine control circuit 220 will be described later. Mode designator 221 is provided for placing the fine control circuit 220, in response to an operation of the operator, in a selected one of an automatic follow-up mode in which the fine control processing is automatically repeated, and a single-command mode in which the fine control processing is effected only when a setting switch 227 is operated to generate a fine control start signal.

Figure 7:
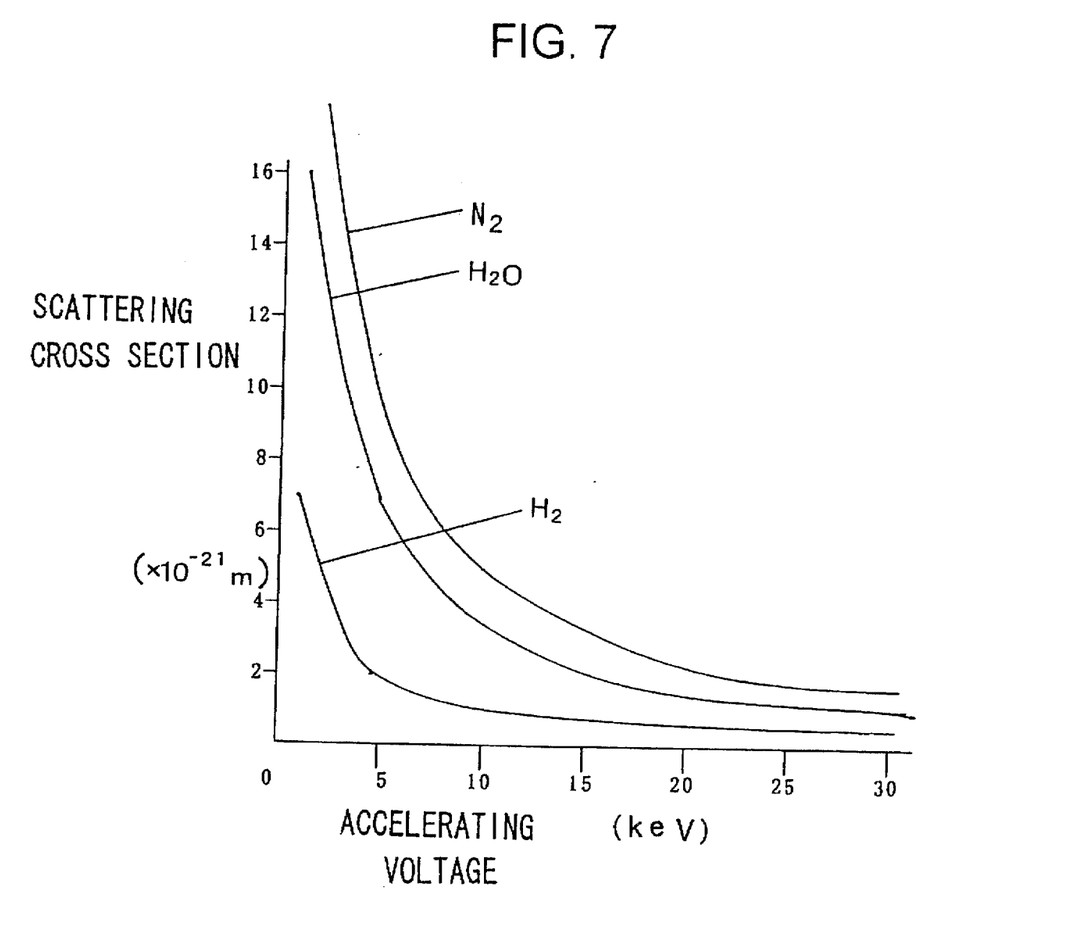
FIG. 7 is a graph showing the relationship between an accelerating voltage and a scattering cross section.

There will be next described the operation of the SEM constructed as described above. Initially, the operator enters the accelerating voltage level Va suited for the specimen 203 through the accelerating voltage setting device 213. The graph of FIG. 7 shows the relationship between the accelerating voltage and the scattering cross section in the case where the gas molecules are those of water vapor or steam, hydrogen and nitrogen. As shown in FIG. 7, the scattering cross section (i.e., probability of collision between the beam of electrons and the gas molecules) increases as the accelerating voltage is lowered. Thus the accelerating voltage level Va is determined in view of the fact that the scattering noise increases and the S/N ratio deteriorates with a decrease in the accelerating voltage. On the basis of this accelerating voltage level Va, the initial value calculating circuit 212 calculates the optimum pressure level PO, distance D between the specimen 203 and the secondary electron detecting electrode 202, and the initial applied voltage level VO.

Figure 8:
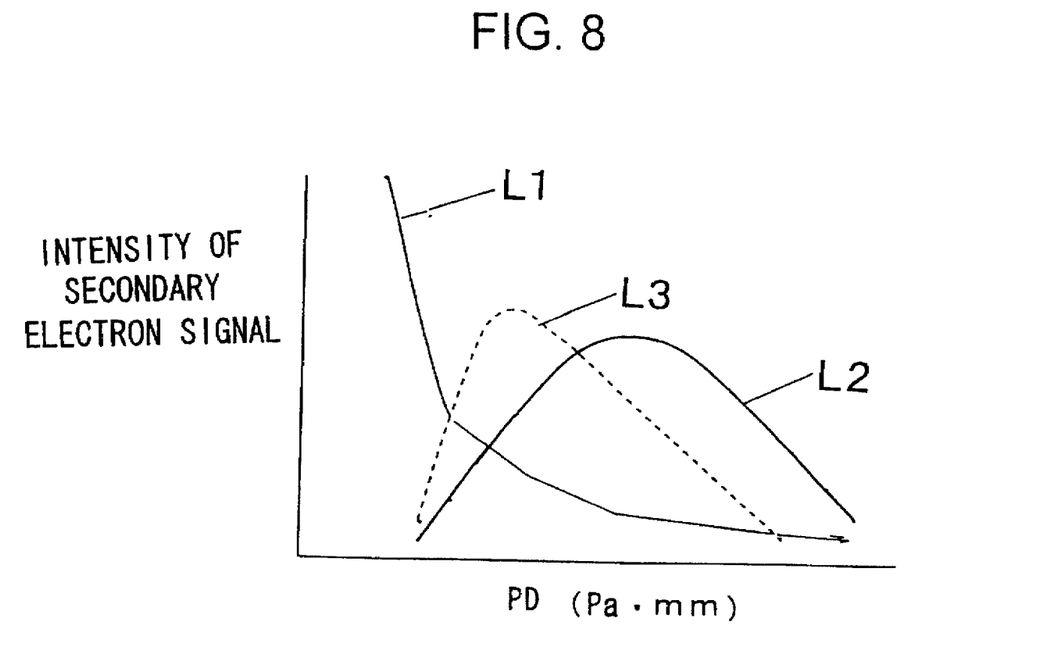
FIG. 8 is a graph showing the relationship between the PD value and the intensity of secondary electron signal.

There will be schematically described a method of calculating the optimum pressure level PO, distance D and the initial applied voltage level VO. The graph of FIG. 8 gives a general idea as to how the intensity of the secondary electron signal varies depending upon the product PD of the pressure P and the distance D where the accelerating voltage is constant. The image of the specimen is influenced by the quantity of the beam of electrons that is incident upon the specimen 203 without being scattered by the gas molecules, and the quantity of the incident beam is determined by the pressure P and distance D of the secondary electron multiplication region A1. On the other hand, the efficiency with which the secondary electrons are detected by the secondary electron detecting electrode 202 is dependent upon the above-indicated product PD. In the graph of FIG. 8, curve L1 represents the intensity of the secondary electron signal that varies depending upon the quantity of the beam of electrons incident upon the specimen 203, and curve L2 represents the intensity of the secondary electron signal that varies depending upon the electron multiplication function of the gas molecules, while curve L3 represents the intensity of the secondary electron signal that is a composite of those represented by the curves L1 and L2.

As is understood from the curve L1, the quantity of primary electrons that are incident upon the specimen 203 without being scattered by the gas molecules is reduced as the PD value increases, whereby the intensity of the second electron signal is reduced. On the other hand, the intensity of the second electron signal varying depending upon the electron multiplication function reaches its peak at a specific PD value, as indicated by the curve L2. With the PD value influencing both the quantity of incidence of the primary electrons and the electron multiplication function, the second electron signal actually detected by the electrode 202 has the intensity as represented by the broken line L3 in FIG. 8, which is a composite of those represented by the curves L1, L2. Thus, the PD value at the peak of the curve L3 is regarded to provide the optimum pressure PO and distance D.

Figure 9:
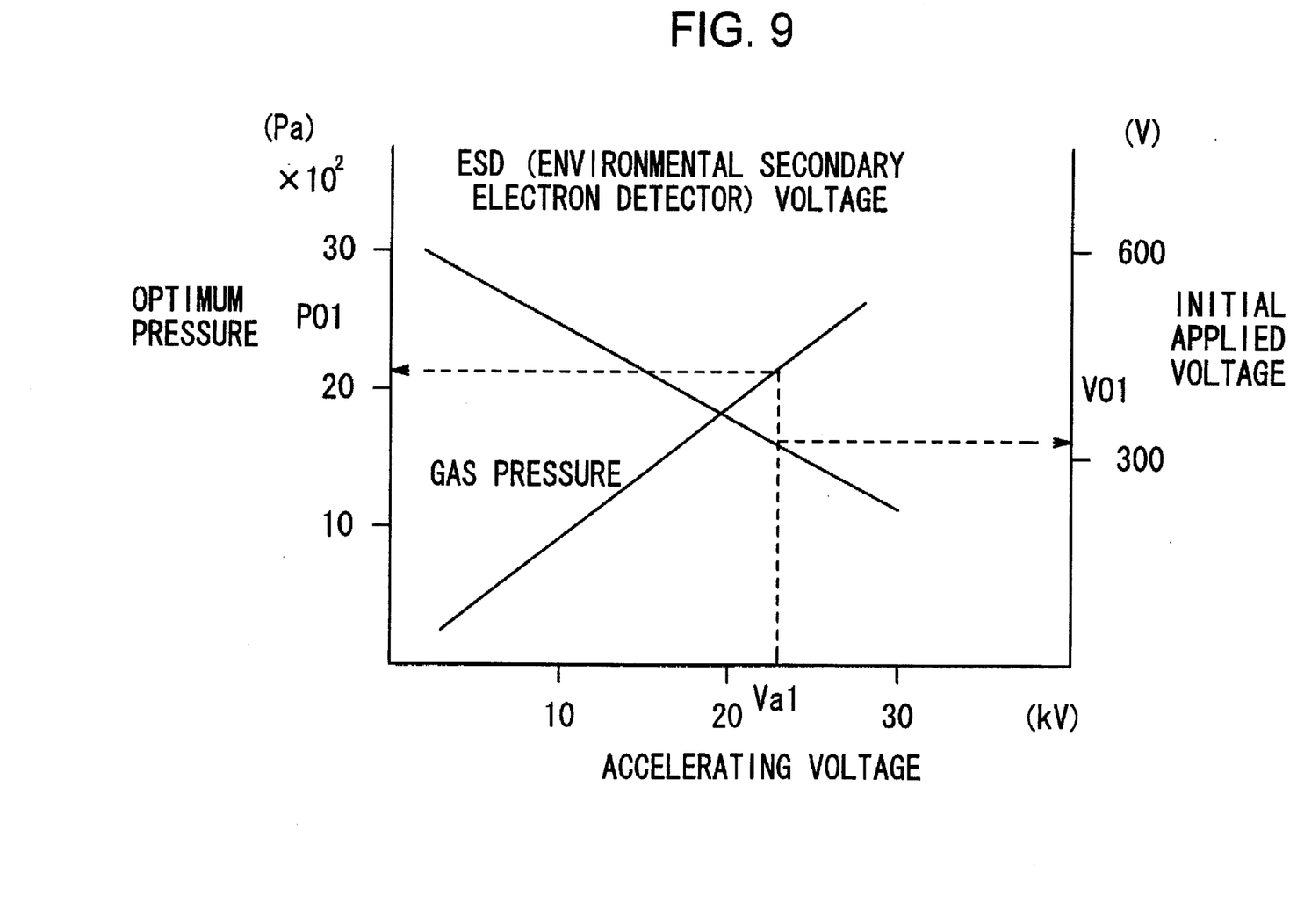
FIG. 9 is a graph showing the relationship among accelerating voltage, optimum pressure and initial applied voltage.

The graph of FIG. 9 shows the relationship among the accelerating voltage, optimum pressure and initial applied voltage. When the accelerating voltage is set to Va1, the optimum pressure level and the initial applied voltage level may be set to PO1 and VO1, respectively. The distance D between the specimen 203 and the secondary electron detecting electrode 202 is calculated on the basis of the PD value obtained from the graph of FIG. 8 and this optimum pressure level PO1. The relationships as shown in FIGS. 7 through 9 may be obtained through experiments or computer simulation.

In this manner, the optimum pressure level PO, distance D and initial applied voltage level VO are calculated. This optimum pressure level PO is fed to the pressure setting circuit 210 so that the pressure of the specimen chamber 201 is set to the optimum level PO, and the pressure control circuit 209 controls open and closed states of the valves 205, 207 so that the pressure P detected by the vacuum gauge 204 coincides with the optimum pressure level PO. The optimum pressure level PO is set to within a range of 100–2700 Pa, for example. The stage control circuit 214 drives the stage 226 so that the distance between the specimen 203 and the secondary electron detecting electrode 202 is controlled to the calculated value D. At the same time, the applied voltage control circuit 211 controls the electrode power source 225 so that the optimum voltage VO is applied to the second electron detecting electrode 202.

The secondary electrons are emitted from the specimen 203 upon incidence of the beam of electrons on the specimen 203, and the secondary electrons thus emitted are multiplied due to collision with gas molecules while passing through the secondary electron multiplication region A1, and then captured by the secondary electron detecting electrode 202. The secondary electron signal corresponding to the secondary electrons captured by the electrode 202 is successively amplified by the pre-amplifier 216 and main amplifier 217, and then converted into a digital image signal by the A/D converter 218 and stored in the memory 219. The fine control circuit 220 evaluates the condition or appearance of the image of the specimen formed on the CRT displays 223, 224. For instance, the fine control circuit 220 calculates the extent to which image characteristics (luminance, contrast and the like) related to the visibility of the specimen image deviate from their optimum ranges. On the basis of the calculated degree of deviation of the luminance and contrast from their optimum ranges, the fine control circuit 220 further effects fine control or adjustment of the gain and DC level of the pre-amplifier 216 through the D/A converter 222. The information related to the luminance is also fed to the applied voltage calculating circuit 215, which in turn calculates the applied voltage level V to be finely controlled on the basis of the luminance information received from the fine control circuit 220, distance between the specimen 203 and the secondary electron detecting electrode 202, and pressure level received from the vacuum gauge 204, and sends out the calculated voltage level V to the applied voltage control circuit 211. Where the luminance is lower than the optimum value, for example, the applied voltage is slightly increased so as to increase the intensity of the secondary electron signal. The applied voltage control circuit 211 controls the electrode power source 225 so that the voltage applied to the secondary electron detecting electrode 202 coincides with the finely controlled voltage level V.

When the automatic follow-up mode is selected by the mode designator 221, the fine control or adjustment of the applied voltage level and the gain and DC level of the pre-amplifier 216 is automatically effected, based on the result of the evaluation of the fine control circuit 220 with respect to the appearance of the formed image of the specimen, so that the luminance and contrast of the specimen image on the CRT displays 223, 224 are kept in the optimum ranges. With the single-command mode being selected, if the fine control start signal is generated from the setting switch 227 in response to the operation of the operator, a series of processings including the evaluation of the fine control circuit 220 on the appearance of the formed image of the specimen, and the fine control of the gain and DC level of the pre-amplifier 216 and the applied voltage value may be effected once, based on the image signal stored in the memory 219 at the time of generation of the fine control start signal. In this single-command mode, the above series of processings may be repeatedly effected for a predetermined period of time.

In the third embodiment as illustrated above, the applied voltage calculating circuit 215 calculates the applied voltage on the basis of the pressure level received from the vacuum gauge 204, and the luminance information received from the fine control circuit 220. However, the applied voltage may be calculated based on only one of the pressure level and luminance information. Further, both of the gain and DC level of the pre-amplifier 216 and the applied voltage may not be necessarily finely controlled at the same time. Rather, the fine control of these levels may be effected as needed depending upon the degree of deviation from their optimum values.

What is claimed is:

1. A scanning electron microscope for forming an image of a specimen based upon a secondary electron signal corresponding to secondary electrons detected by a secondary electron detecting electrode, said secondary electrons being emitted from the specimen when irradiated with a beam of electrons and multiplied in a secondary electron multiplication region having a controlled gaseous atmosphere at a predetermined pressure, comprising:

a multiplication environment detecting section that detects a physical quantity related to a degree of multiplication of said secondary electrons; and a specimen image adjusting section that adjusts an appearance of the formed image of the specimen based upon a result of detection of said multiplication environment detecting section.

2. A scanning electron microscope as defined in claim 1, wherein:

said multiplication environment detecting section detects a degree of vacuum in said secondary electron multiplication region as said physical quantity; and said specimen image adjusting section adjusts the appearance of the formed image of the specimen by controlling a voltage applied to said secondary electron detecting electrode based upon said degree of vacuum detected by said multiplication environment detecting section.

3. A scanning electron microscope as defined in claim 1, further comprising:

a signal processing circuit that forms the image of the specimen based upon said secondary electron signal detected by said secondary electron detecting electrode, and wherein said specimen image adjusting section controls at least one processing condition of said signal processing circuit based upon said result of detection of said multiplication environment detecting section, so as to adjust the appearance of the formed image of the specimen.

4. A scanning electron microscope as defined in claim 1, wherein:

said specimen image adjusting section adjusts the appearance of the formed image of the specimen so that an image characteristic value related to visibility of the image of the specimen is held within a predetermined range.

5. A scanning electron microscope as defined in claim 4, wherein:

said image characteristic value related to the visibility of the image of the specimen comprises at least one of luminance and contrast of the image of the specimen.

6. A scanning electron microscope for forming an image of a specimen based upon a secondary electron signal corresponding to secondary electrons detected by a secondary electron detecting electrode, said secondary electrons being emitted from the specimen when irradiated with a beam of electrons and multiplied in a secondary electron multiplication region having a controlled gaseous atmosphere at a predetermined pressure, comprising:

a specimen image evaluating section that evaluates an appearance of the formed image of the specimen; and a multiplication environment control section that controls a physical quantity related to a degree of multiplication of said secondary electrons, based upon a result of evaluation of said specimen image evaluating section.

7. A scanning electron microscope as defined in claim 6, wherein:

said multiplication environment control section controls said physical quantity so that an image characteristic value related to visibility of the image of the specimen is held in a predetermined range.

8. A scanning electron microscope as defined in claim 7, wherein:

said physical quantity to be controlled comprises a voltage applied to said secondary electron detecting electrode.

9. A scanning electron microscope comprising:

a secondary electron detecting electrode for detecting secondary electrons emitted from a specimen when irradiated with a beam of electrons;

a voltage source that applies a positive voltage to said secondary electron detecting electrode;

a gas supplier section that supplies a gas having an electron multiplication function to a secondary electron multiplication region between said specimen and said secondary electron detecting electrode;

an evacuating section that evacuates said secondary electron multiplication region;

a vacuum degree determining section that determines a degree of vacuum in said secondary electron multiplication region; and a voltage control section that controls the positive voltage applied from said voltage source to said secondary electron detecting electrode, based upon the degree of vacuum determined by said vacuum degree determining section.

10. A scanning electron microscope comprising:

a secondary electron detecting electrode for detecting secondary electrons emitted from a specimen when irradiated with a beam of electrons on the specimen;

a voltage source that applies a positive voltage to said secondary electron detecting electrode;

a gas supplier section that supplies a gas having an electron multiplication function to a secondary electron multiplication region between said specimen and said secondary electron detecting electrode;

an evacuating section that evacuates said secondary electron multiplication region;

a signal processing circuit that forms an image of said specimen based upon a secondary electron signal corresponding to said secondary electrons detected by said secondary electron detecting electrode;

a specimen image evaluating section that evaluates an appearance of the formed image of the specimen; and a voltage control section that controls the positive voltage applied from said voltage source to said secondary electron detecting electrode, based upon a result of evaluation of said specimen image evaluating section.

11. A scanning electron microscope comprising:

a secondary electron detecting electrode for detecting secondary electrons emitted from a specimen when irradiated with a beam of electrons on the specimen;

a voltage source that applies a positive voltage to said secondary electron detecting electrode;

a gas supplier section that supplies a gas having an electron multiplication function to a secondary electron multiplication region between said specimen and said secondary electron detecting electrode;

an evacuating section that evacuates said secondary electron multiplication region;

a signal processing circuit that forms an image of said specimen based upon a secondary electron signal corresponding to said secondary electrons detected by said secondary electron detecting electrode;

a vacuum degree determining section that determines a degree of vacuum in said secondary electron multiplication region;

a first voltage control section that controls the positive voltage applied from said voltage source to said secondary electron detecting electrode, based upon the degree of vacuum determined by said vacuum degree determining section;

a specimen image evaluation section that evaluates an appearance of the formed image of the specimen after said positive voltage is controlled by said first voltage control section; and a second voltage control section that controls the positive voltage applied from said voltage source to said secondary electron detecting electrode, based upon a result of evaluation of said specimen image evaluation section.

12. A scanning electron microscope for forming an image of a specimen based upon a secondary electron signal corresponding to secondary electrons detected by a secondary electron detecting electrode, said secondary electrons being emitted from the specimen when irradiated with a beam of electrons and multiplied in a secondary electron multiplication region having a controlled gaseous atmosphere at a predetermined pressure, comprising:

an arithmetic section that calculates a physical quantity related to a degree of multiplication of said secondary electrons, depending upon an accelerating voltage of said beam of electrons; and a setting section that sets said physical quantity based upon a result of calculation of said arithmetic section.

13. A scanning electron microscope as defined in claim 12, wherein:

said physical quantity comprises a pressure of said secondary electron multiplication region; and said setting section sets said pressure of the secondary electron multiplication region to a level of the pressure calculated by said arithmetic section.

14. A scanning electron microscope as defined in claim 12, wherein:

said physical quantity comprises a voltage applied to said secondary electron detecting electrode; and said setting section sets said voltage to a level of the voltage calculated by said arithmetic section.

15. A scanning electron microscope as defined in claim 12, further comprising:

a stage on which said specimen is placed such that the specimen is movable toward or away from said secondary electron detecting electrode, wherein:

said physical quantity comprises a distance between said specimen and said secondary electron detecting electrode; and said setting section drives said stage depending upon the distance calculated by said arithmetic section.

16. A scanning electron microscope as defined in claim 12, further comprising:

a stage on which said specimen is placed such that the specimen is movable toward or away from said secondary electron detecting electrode, wherein:

said physical quantity comprises a pressure of said secondary electron multiplication region, a voltage applied to the secondary electron detecting electrode, and a distance between said specimen and the secondary electron detecting electrode; and said setting section sets said pressure of the secondary electron multiplication region to a level of the pressure calculated by said arithmetic section, sets said voltage applied to the secondary electron detecting electrode to a level of the voltage calculated by said arithmetic section, and drives said stage depending upon the distance calculated by said arithmetic section.

17. A scanning electron microscope as defined in claim 12, further comprising:

a specimen image evaluating section that evaluates an appearance of the formed image of the specimen; and a specimen image adjusting section that adjusts the appearance of the formed image of the specimen based upon a result of evaluation of said specimen image evaluating section so that an image characteristic value related to visibility of the image of the specimen is held in a predetermined range.

18. A scanning electron microscope as defined in claim 17, further comprising:

a signal processing circuit that forms the image of the specimen based upon said secondary electron signal detected by said secondary electron detecting electrode, wherein said specimen image adjusting section adjusts the appearance of the formed image of the specimen by controlling at least one processing condition of said signal processing circuit.

19. A scanning electron microscope as defined in claim 17, wherein:

said specimen image adjusting section adjusts the appearance of the formed image of the specimen by controlling a voltage applied to said second electron detecting electrode.

20. A scanning electron microscope as defined in claim 17, wherein:

said characteristic value related to the visibility of the image of the specimen comprises at least one of luminance and contrast of the image of the specimen.

21. A scanning electron microscope as defined in claim 12, further comprising:

a specimen image evaluating section that evaluates an appearance of the formed image of the specimen;

a pressure detecting device that detects a pressure of said secondary electron multiplication region; and a specimen image adjusting section that adjusts the appearance of the formed image of the specimen based upon a result of evaluation of said specimen image evaluating section and a detected value of said pressure detecting device, so that an image characteristic value related to visibility of the specimen image is held in a predetermined range.

22. A scanning electron microscope as defined in claim 21, wherein:

said specimen image adjusting section adjusts the appearance of the formed image of the specimen by controlling a voltage applied to said secondary electron detecting electrode.

23. A scanning electron microscope as defined in claim 22, wherein:

said specimen image adjusting section is operated in a selected one of an automatic follow-up mode in which the specimen image adjusting section initiates adjustment of the image of the specimen in response to at least one of a variation in the pressure of said secondary electron multiplication region and a change of the voltage applied to said secondary electron detecting electrode, and a single-command mode in which the specimen image adjusting section initiates adjustment of the image of the specimen only when a predetermined initiating operation is conducted irrespective of a presence of said variation in the pressure and/or said change of the voltage.

* * * * *